(12) United States Patent
Wu et al.

(10) Patent No.: US 8,937,486 B2
(45) Date of Patent: Jan. 20, 2015

(54) METHOD FOR TESTING THROUGH-SILICON-VIA

(71) Applicant: National Tsing Hua University, Hsinchu (TW)

(72) Inventors: Cheng-Wen Wu, Hsinchu County (TW); Po-Yuan Chen, Tainan (TW); Ding-Ming Kwai, Hsinchu County (TW); Yung-Fa Chou, Kaohsiung (TW)

(73) Assignee: National Tsing Hua University, Hsinchu (TW)

( * ) Notice: Subject to any disclaimer, the term of this patent is extended or adjusted under 35 U.S.C. 154(b) by 25 days.

(21) Appl. No.: 13/939,408

(22) Filed: Jul. 11, 2013

(65) Prior Publication Data

US 2013/0293255 A1 Nov. 7, 2013

Related U.S. Application Data

(62) Division of application No. 12/775,367, filed on May 6, 2010, now Pat. No. 8,531,199.

(51) Int. Cl.
| | | |
|---|---|---|
| G01R 31/26 | (2014.01) | |
| G01R 31/28 | (2006.01) | |
| H01L 21/66 | (2006.01) | |
| H01L 21/768 | (2006.01) | |

(52) U.S. Cl.
CPC ........ *G01R 31/2601* (2013.01); *G01R 31/2853* (2013.01); *H01L 22/14* (2013.01); *H01L 22/34* (2013.01); *H01L 21/76898* (2013.01); *H01L 2924/0002* (2013.01)
USPC .................................................. 324/762.01

(58) Field of Classification Search
CPC ..................... G01R 31/2601; G01R 31/2853
See application file for complete search history.

(56) References Cited

U.S. PATENT DOCUMENTS

| | | | | |
|---|---|---|---|---|
| 7,977,962 | B2 * | 7/2011 | Hargan et al. | 324/762.01 |
| 8,219,340 | B2 * | 7/2012 | Su et al. | 702/71 |
| 8,294,240 | B2 * | 10/2012 | Nowak et al. | 257/532 |
| 8,531,199 | B2 * | 9/2013 | Wu et al. | 324/762.01 |
| 8,742,839 | B2 * | 6/2014 | Shih et al. | 327/564 |
| 2009/0002012 | A1 * | 1/2009 | Doong et al. | 324/765 |
| 2010/0156453 | A1 * | 6/2010 | Doong et al. | 324/765 |
| 2011/0080184 | A1 * | 4/2011 | Wu et al. | 324/750.3 |
| 2011/0080185 | A1 * | 4/2011 | Wu et al. | 324/750.3 |
| 2012/0018723 | A1 * | 1/2012 | Su et al. | 257/48 |
| 2014/0070838 | A1 * | 3/2014 | Vukic et al. | 324/762.03 |
| 2014/0266291 | A1 * | 9/2014 | Fkih et al. | 324/762.01 |

\* cited by examiner

*Primary Examiner* — Jermele M Hollington
(74) *Attorney, Agent, or Firm* — Jackson IPG PLLC

(57) ABSTRACT

A method for testing a TSV comprises charging a through-silicon-via under test to a first predetermined voltage level charging a capacitance device to a second predetermined voltage level; performing charge-sharing between the through-silicon-via and the capacitance device; and determining that the through-silicon-via under test is not faulty if the voltage level of the through-silicon-via after the charge-sharing step is within a predetermined range.

7 Claims, 15 Drawing Sheets

METHOD FOR TESTING THROUGH-SILICON-VIA

CROSS-REFERENCE TO A RELATED APPLICATION

This application is a divisional application of U.S. patent application Ser. No. 12/775,367 filed May 6, 2010, which is a Continuation-In-Part (CIP) Application of, and claims priority to, U.S. patent application Ser. No. 12/572,030 filed on Oct. 1, 2009, all of which are hereby incorporated by reference as if set forth herein.

BACKGROUND OF THE INVENTION

1. Field of the Invention

The present invention relates to a test method, and more particularly, to a method for testing a through-silicon-via.

2. Description of the Related Art

Three-dimensional integrated circuit (3D IC) technology, a promising technology in the field of modern electronics, is a technology in which two or more layers of active electronic components are integrated into a chip. In other words, a 3D IC packages a plurality of ICs into a single chip. Compared with a traditional single IC chip, a 3D IC provides a faster signal transmission rate between ICs, generates less noise, consumes less power, occupies less space and produces better performance.

Recent research and development in 3D IC technology has emphasized the benefit of increased packing density attainable by stacking a growing number of ICs. In addition, 3D IC technology offers an opportunity to integrate heterogeneous processes in a more efficient manner, improves speed performance with smaller interconnect delays, decreases power consumption with shorter wire lengths and increases data bandwidth by using short vertical links or vertical interconnection between dies known as through-silicon-via (TSV). According to the step of TSV formation in an overall 3D IC manufacturing sequence, we could classify TSV technologies into two main categories, namely, via-first and via-last. One categorization is to separate by the bonding step. The via-first processes form the TSVs on each wafer prior to the bonding step, and the via-last processes form the TSVs after. Compared with other alternatives for linking the plurality of ICs, such as wire bonding and micro-bumping, TSVs achieve higher interconnection density and better performance.

In spite of the advantages mentioned above, there are some problems associated with 3D IC technology. One of the most important issues is the compound yield loss due to IC stacking To guarantee the stacking yield, the interconnection must be tested. The current interconnection test proposed for 3D IC is done with two or more dies in a stack, which is good only for TSVs after bonding. Essentially, after two dies are bonded, the TSVs can be connected serially to form a daisy chain in an electric test or connected with flip-flops to form a scan chain in a structure test. There needs high reliability TSV channels for test control or scan path. With the same test circuit in each layer, they can be tested in a complete or partial stack.

However, there are some limitations in these test schemes. First, they cannot be performed before bonding. A straightforward way for an electric test uses a daisy chain structure of by alternate routes of TSVs on both the front and back sides of the wafer. Apparently, this scheme is suitable only for the wafer acceptance test (WAT), since it is extremely difficult, if not impossible, to dismantle and rework the back metal once the TSV test is done. As a result, the observation of TSV failures at this stage relies solely on a couple of test keys on the scribe line. Second, individual TSVs are indistinguishable in a serial scan chain or a daisy chain, so diagnosis becomes an issue. Probing both ends of a TSV can measure its resistance as the pass/fail criterion, but the area overhead for direct access is high, and thus is limited to a small number of sparse TSVs. Also, in general, for a die before bonding, the TSVs have one end on the backside that is not only floating but also buried deeply in the wafer substrate before thinning. Third, in the case of a via-first process, which intend to provide an interconnection density as high as $10^4/mm^2$, on-chip TSV monitoring becomes necessary. However, there are not always flip-flops connected to both ends of each TSV. In addition, the TSV failure rate affects the final yield exponentially with the number of dies in a stack. Unfortunately, it remains relatively high (>10 ppm). Without screening out the bad ones, the overall yield of the die stack will be low.

In view of the above, it is necessary to design a test method, which not only can be performed on TSVs before bonding, but also allows each TSV to be tested individually.

SUMMARY OF THE INVENTION

A method for testing a TSV according to one embodiment of the present invention comprises the steps of: charging a through-silicon-via under test to a first predetermined voltage level charging a capacitance device to a second predetermined voltage level; performing charge-sharing between the through-silicon-via and the capacitance device; and determining that the through-silicon-via under test is not faulty if the voltage level of the through-silicon-via after the charge-sharing step is within a predetermined range.

BRIEF DESCRIPTION OF THE DRAWINGS

The objectives and advantages of the present invention will become apparent upon reading the following description and upon referring to the accompanying drawings of which.

DETAILED DESCRIPTION OF THE INVENTION

Figure 1:
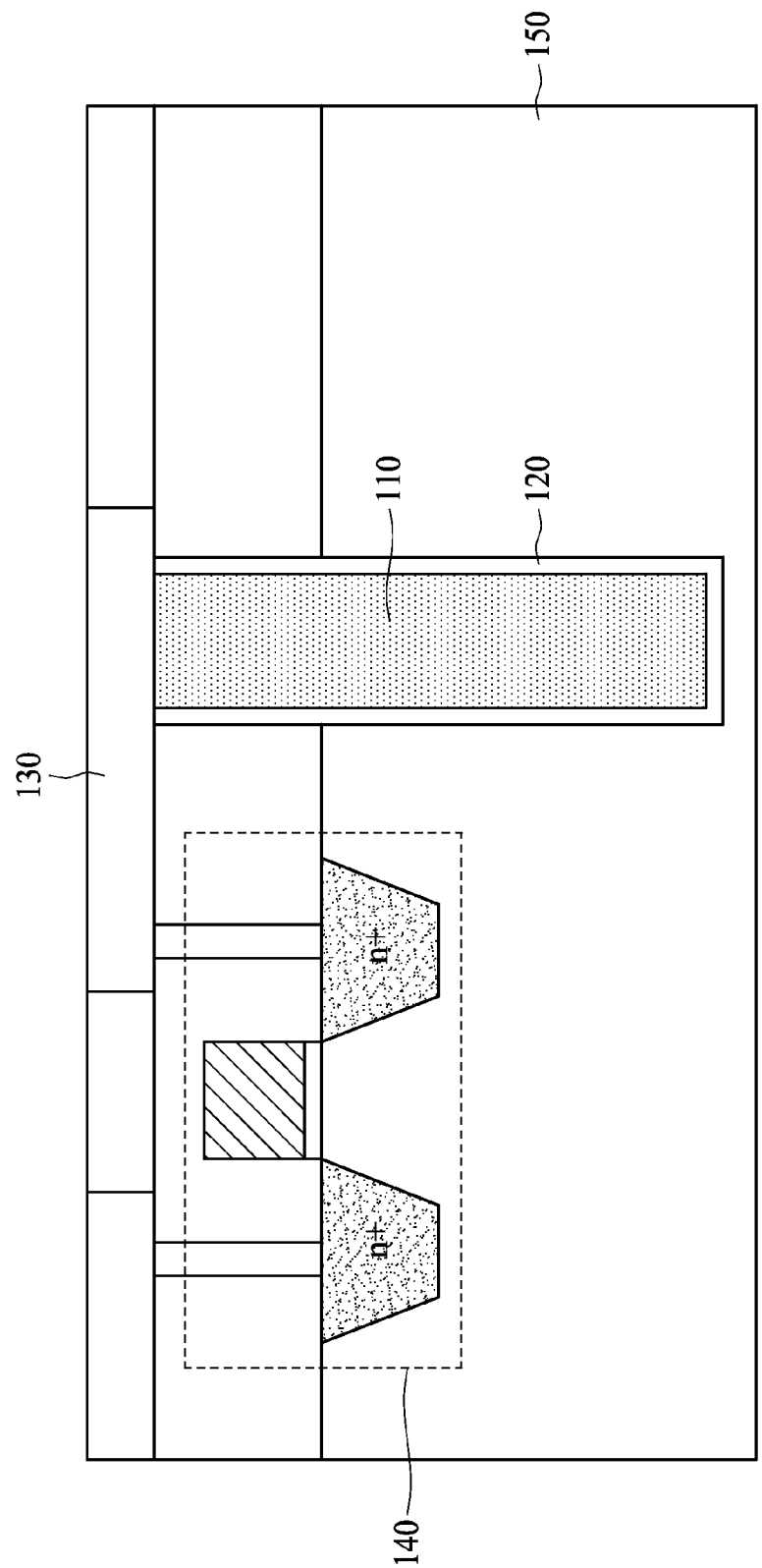
FIG. 1 shows a cross-section view of a TSV.

FIG. 1 shows a cross-section view of a TSV before wafer grinding/thinning on the backend. As shown in FIG. 1, the TSV 110 is formed in a substrate 150 and is electrically connected to an NMOS transistor 140 nearby. One end of the TSV 110 is connected to a metal layer 130, and the other end of the TSV 110 is floating with a surrounding dielectric layer 120 to insulate the TSV 110 from the substrate 150. It can be derived from FIG. 1 that since the TSV 110 is surrounded by the dielectric layer 120 within the substrate 150, the TSV 110 may exhibit a resistance property, a capacitance property or the combined property. It should be noted that a TSV cannot only applied to an NMOS transistor, it can be applied to a PMOS transistor or other active or passive components as well.

One type of defect of a TSV is a break type defect. A break in the TSV may cause an open failure. With such a failure, the signal does not pass from one end of the TSV to the other end in a specific period of time. The effective capacitance measured from the top end of the TSV is reduced. Another type of defect of a TSV is an impurity defect. The TSV is not uniformly covered by the dielectric layer, which is caused by impurities or dust during the fabrication process. Such failure may lead to a low breakdown voltage or even a possible short between the TSV and the substrate.

When a TSV exhibits a defect, such as the aforementioned defect cases, the property of the TSV is varied such that the TSV performs abnormally. Therefore, unlike the conventional test schemes wherein both ends of the TSV are accessed, in the embodiments of the present invention, the property variation of the TSV is measured by a sense amplification technique, such as, but not limited to, the sense amplification technique used in a DRAM.

Figure 2:
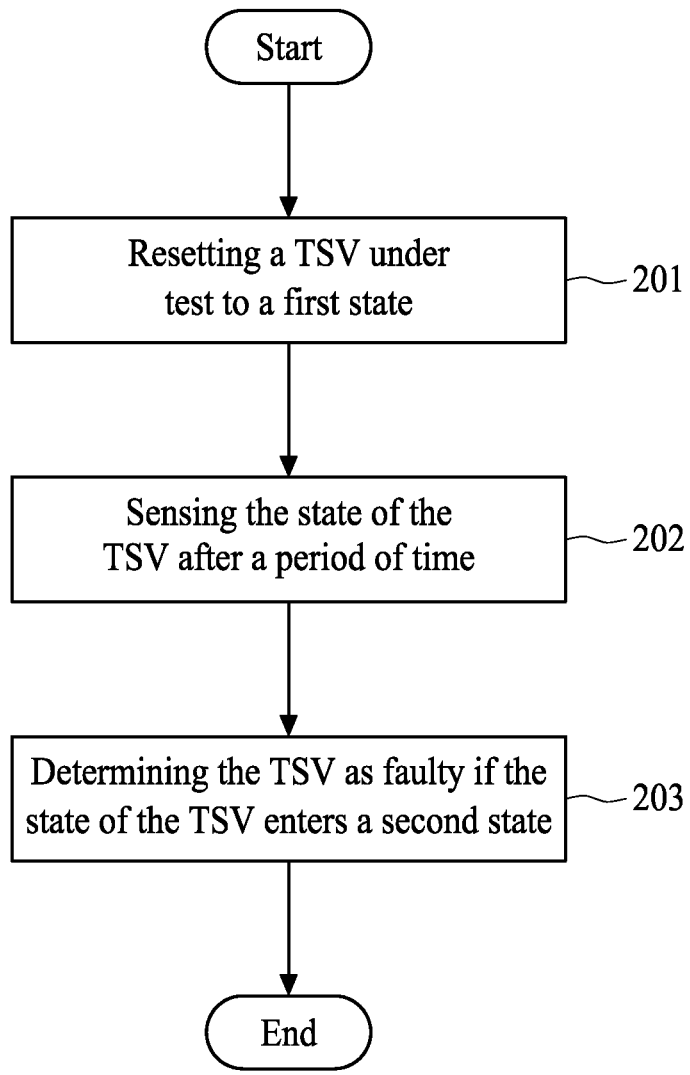
FIG. 2 shows the flowchart of a method for testing a TSV according to an embodiment of the present invention.

FIG. 2 shows the flowchart of a method for testing a TSV according to one embodiment of the present invention. In step 201, a TSV under test is reset to a first state, and step 202 is executed. In this embodiment, if the voltage of the TSV is at a first voltage threshold, such as $V_{dd}$, the TSV is in the first state. Therefore, in step 201, the voltage of the TSV is charged to a high voltage level $V_{dd}$. In step 202, the state of the TSV is sensed after a period of time, and step 203 is executed. In step 203, if the TSV enters a second state, the TSV is determined to be faulty. In this embodiment, if the voltage of the TSV is below a second voltage threshold $V_{th\_H}$, the TSV is in the second state.

Figure 3:
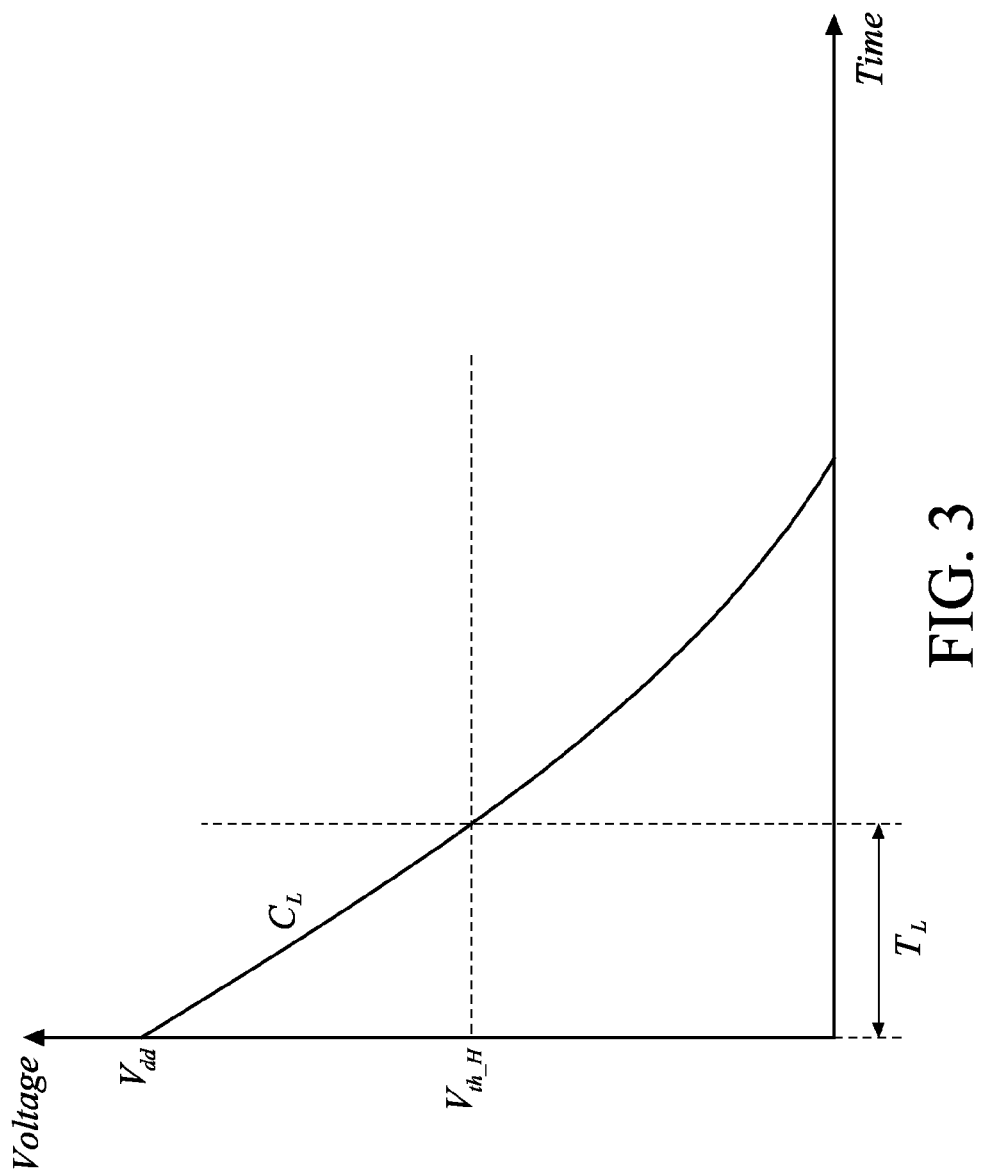
FIG. 3 shows a comparison of the threshold voltage of the TSV sensing and discharge time according to an embodiment of the present invention.

FIG. 3 shows a comparison of the threshold voltage of the TSV sensing and discharge time according to the method shown in FIG. 2. As shown in FIG. 3, the transverse axis is the discharge time of the TSV, the longitudinal axis is the voltage of the TSV, and $C_L$ is the minimum capacitance that provides a voltage greater than the threshold voltage $V_{th\_H}$ after a period of discharge time $T_L$. If the voltage of the TSV is smaller than $V_{th\_H}$ after a period of discharge time $T_L$, the TSV is determined to in the second state, and the TSV is determined to be faulty. In this way, those TSVs with capacitance smaller than $C_L$ are determined to be faulty, wherein the value of $C_L$ can be determined by adjusting the period of discharge time $T_L$ and the threshold voltage $V_{th\_H}$.

It should be noticed that the property of the TSV is not only determined by its capacitance characteristic, but can be determined by other characteristics as well, such as resistance characteristic. The method for testing a TSV of the present invention is not limited to the TSVs exhibiting capacitance characteristic, but can also be applied to those TSVs exhibiting other characteristics as well.

In some embodiments of the present invention, the state of the TSV under test is determined differently from the method shown in FIG. 2. For instance, in some embodiments, if the voltage of the TSV is below a first voltage threshold, the TSV is in the first state, and if the voltage of the TSV is above a second voltage threshold, the TSV is in the second state, wherein the first voltage threshold is smaller than the second voltage threshold. In such cases, the voltage of the TSV is discharged to a low voltage level in step 201, such as the ground level, and in step 202, the TSV is charged and sensed after a period of time. In some embodiments, the state of the TSV is determined by its current level rather than its voltage level.

Figure 4:
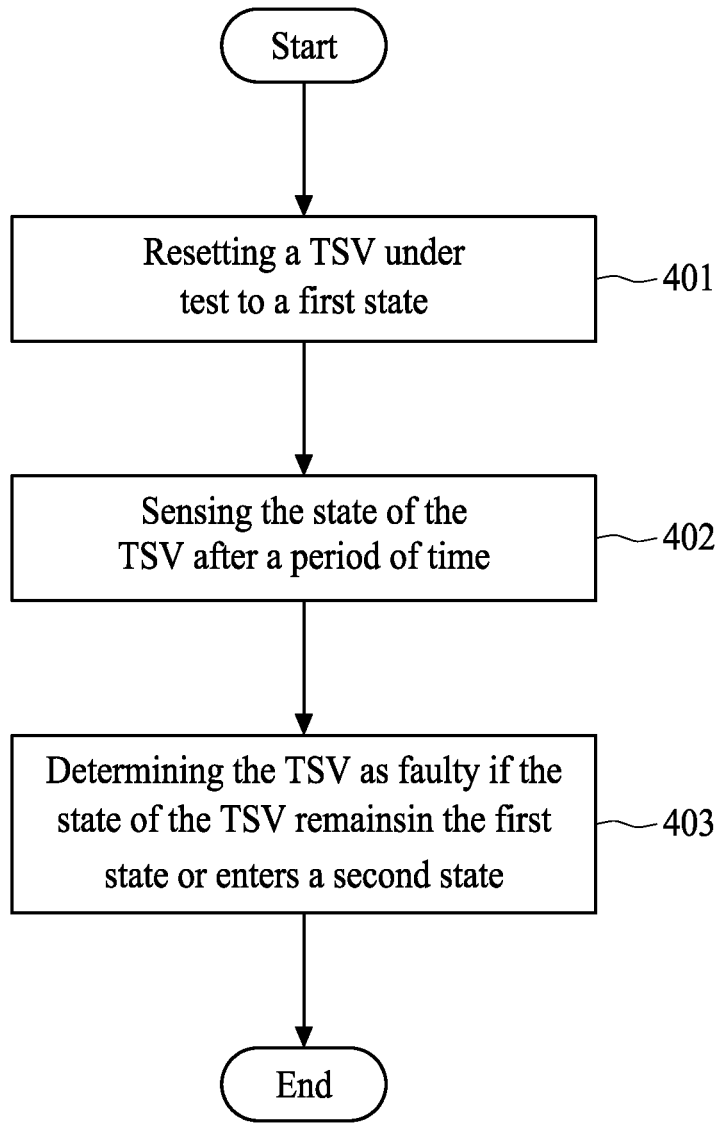
FIG. 4 shows the flowchart of a method for testing a TSV according to another embodiment of the present invention.

FIG. 4 shows the flowchart of a method for testing a TSV according to another embodiment of the present invention. In step 401, a TSV under test is reset to a first state, and step 402 is executed. In this embodiment, if the voltage of the TSV is at a first voltage threshold, such as $V_{dd}$, the TSV is in the first state. Therefore, in step 401, the voltage of the TSV is charged to a high voltage level $V_{dd}$. In step 402, the state of the TSV is sensed after a period of time, and step 403 is executed. In step 403, if the TSV remains in the first state or enters a second state, the TSV is determined to be faulty. In this embodiment, if the voltage of the TSV is below the first voltage threshold $V_{dd}$ and above a second voltage threshold $V_{th\_L}$, the TSV is in the second state.

Figure 5:
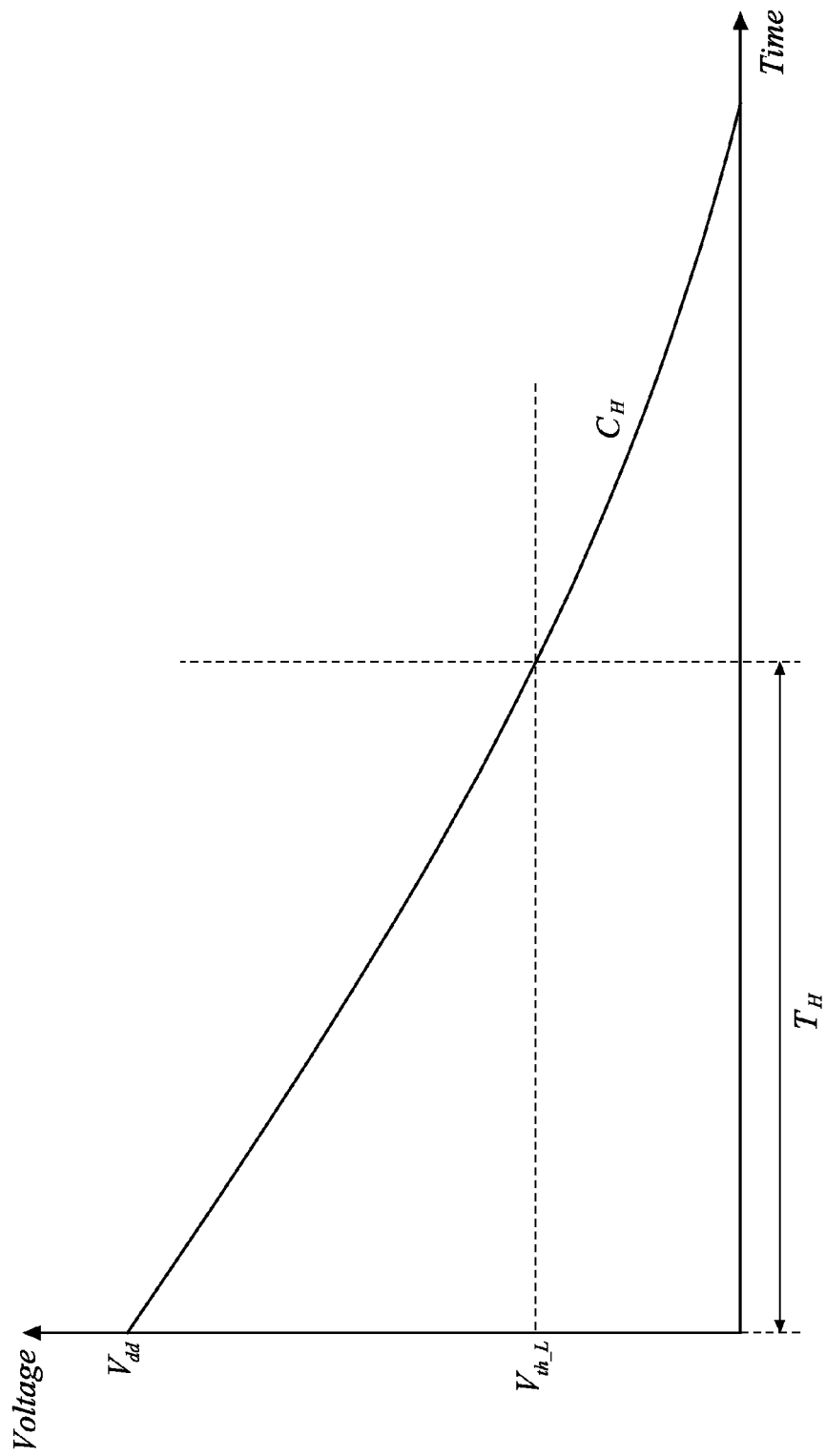
FIG. 5 shows a comparison of the threshold voltage of the TSV sensing and discharge time according to another embodiment of the present invention.

FIG. 5 shows a comparison of the threshold voltage of the TSV sensing and discharge time according to the method shown in FIG. 4. As shown in FIG. 5, the transverse axis is the discharge time of the TSV, the longitudinal axis is the voltage of the TSV, and $C_H$ is the maximum capacitance that provides a voltage lower than the threshold voltage $V_{th\_L}$ after a period of discharge time $T_H$. If the voltage of the TSV is greater than $V_{th\_L}$ after a period of discharge time $T_H$, the TSV is determined to be faulty. In this way, those TSVs with capacitance greater than $C_H$ are determined to be faulty, and the value of $C_H$ can be determined by adjusting the period of discharge time $T_H$ and the threshold voltage $V_{th\_L}$.

In some embodiments of the present invention, the state of the TSV under test is determined differently from the method shown in FIG. 4. For instance, in some embodiments, if the voltage of the TSV is below a first voltage threshold, the TSV is in the first state, and if the voltage of the TSV is above the first voltage threshold and below a second voltage threshold, the TSV is in the second state, wherein the first voltage threshold is smaller than the second voltage threshold. In such cases, the voltage of the TSV is discharged to a low voltage level in step 401, such as the ground level, and in step 402, the TSV is charged and sensed after a period of time. In some embodiments, the state of the TSV is determined by its current level other than its voltage level.

Figure 6:
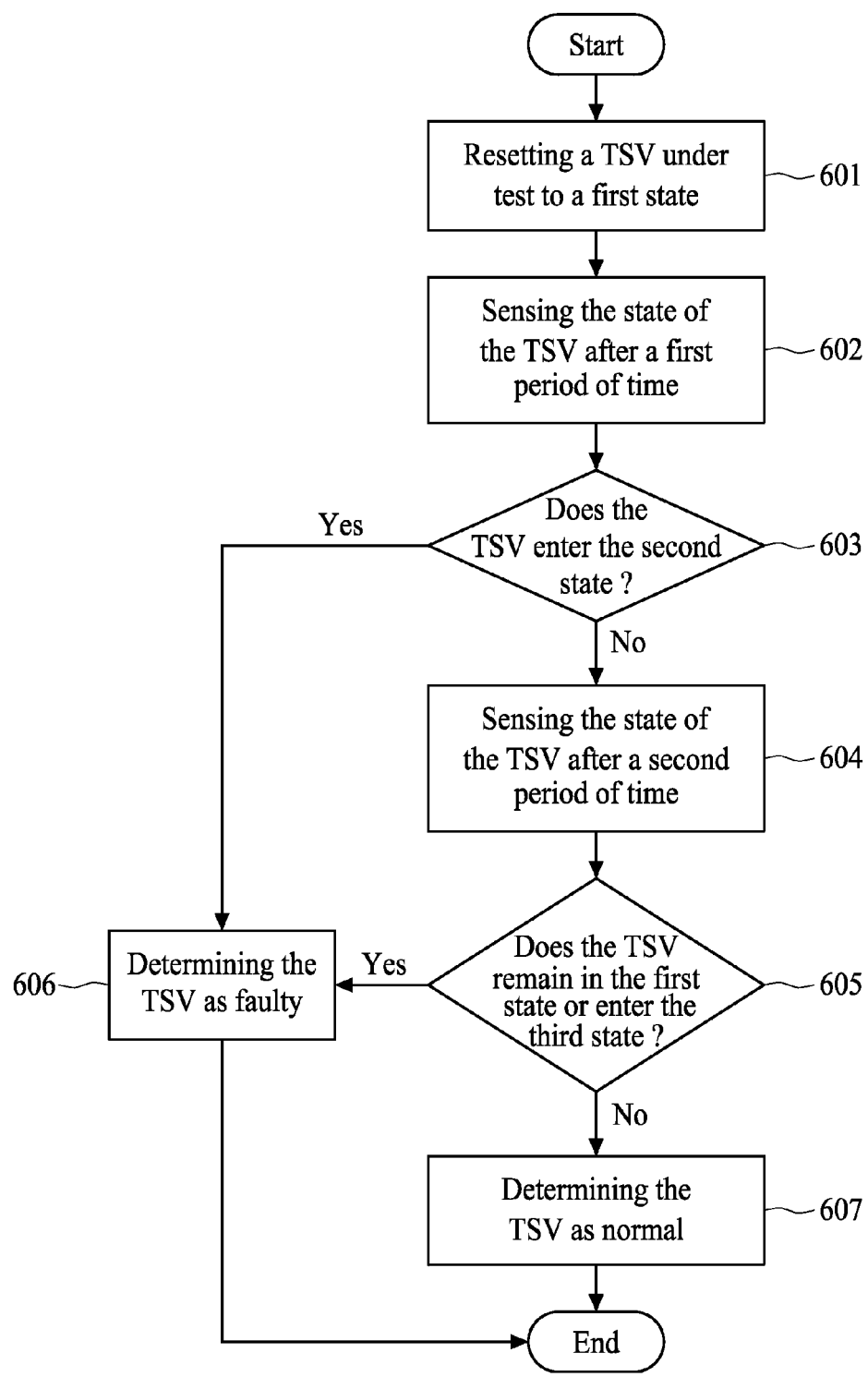
FIG. 6 shows the flowchart of a method for testing a TSV according to another embodiment of the present invention.

The methods shown in FIGS. 2 and 4 can be integrated into one method. FIG. 6 shows the flowchart of a method for testing a TSV according to another embodiment of the present invention. In step 601, a TSV under test reset to a first state, and step 602 is executed. In this embodiment, if the voltage of the TSV is at a first voltage threshold, such as $V_{dd}$, the TSV is in the first state. In step 602, the state of the TSV is sensed after a first period of time, and step 603 is executed. In step 603, it is determined whether the TSV enters a second state. If not, step 604 is executed; otherwise, step 606 is executed. In step 604, the state of the TSV is sensed after a second period of time, and step 605 is executed. In step 605, it is determined whether the TSV remains in the first state or enters a third state. If not, step 607 is executed; otherwise, step 606 is executed. In step 606, the TSV is determined to be faulty. In step 607, the TSV is determined to be normal. In this embodiment, if the voltage of the TSV is below a second voltage threshold $V_{th\_H}'$, the TSV is in the second state. If the voltage of the TSV is below the first voltage threshold $V_{dd}$ and above a third voltage threshold $V_{th\_L}'$, the TSV is in the third state, wherein the second voltage threshold is greater than or equal to the third voltage threshold.

Figure 7:
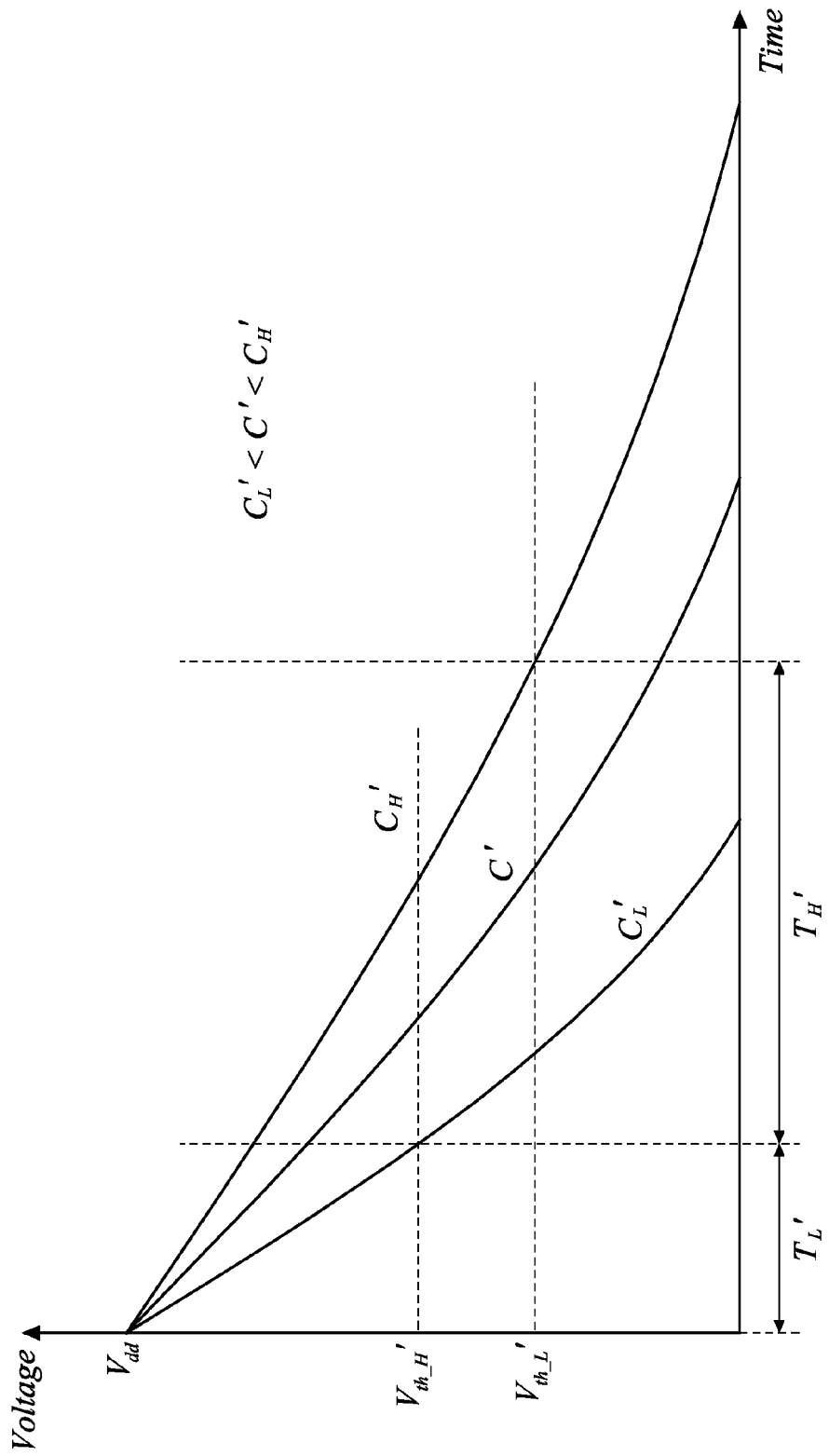
FIG. 7 shows a comparison of the threshold voltage of the TSV sensing and discharge time according to another embodiment of the present invention.

FIG. 7 shows a comparison of the threshold voltage of the TSV sensing and discharge time according to the method shown in FIG. 6. As shown in FIG. 7, the transverse axis is the discharge time of the TSV, the longitudinal axis is the voltage of the TSV, $C_L'$ is the minimum capacitance that provides a voltage greater than or equal to the second threshold voltage $V_{th\_H}'$ after a first period of discharge time $T_L'$, $C_H'$ is the maximum capacitance that provides a voltage smaller than or equal to the third threshold voltage $V_{th\_L}'$ after a second period of discharge time $T_H'$, and C' is the capacitance of a normal TSV. If the voltage of the TSV is smaller than the first threshold voltage $V_{th\_H}'$ after a first period of discharge time $T_L'$, or the voltage of the TSV is greater than the second threshold voltage $V_{th\_L}$ after a second period of discharge time $T_H'$, the TSV is determined to be faulty. In this way, those TSVs with capacitance smaller than $C_L'$ and those TSVs with capacitance greater than $C_H'$ are determined to be faulty, wherein the values of $C_L'$ and $C_H'$ can be determined by adjusting the period of discharge time $T_H'$ and $T_L'$ and the threshold voltage $V_{th\_L}$ and $V_{th\_H}'$.

In some embodiments of the present invention, the state of the TSV under test is determined differently from the method shown in FIG. 6. For instance, in some embodiments, if the voltage of the TSV is below a first voltage threshold, the TSV is in the first state, and if the voltage of the TSV is above the first voltage threshold and below a second voltage threshold, the TSV is in the second state, if the voltage of the TSV is above the second voltage threshold and below a third voltage threshold, the TSV is in the second state, wherein the first voltage threshold is smaller than the second voltage threshold, and the second voltage threshold is smaller than the third voltage threshold. In such cases, the voltage of the TSV is discharged to a low voltage level in step 601, such as the ground level, in step 602, the TSV is charged and sensed after a first period of time, and step 604, the TSV is charged and sensed after a second period of time. In some embodiments, the state of the TSV is determined by its current level other than its voltage level.

Figure 8:
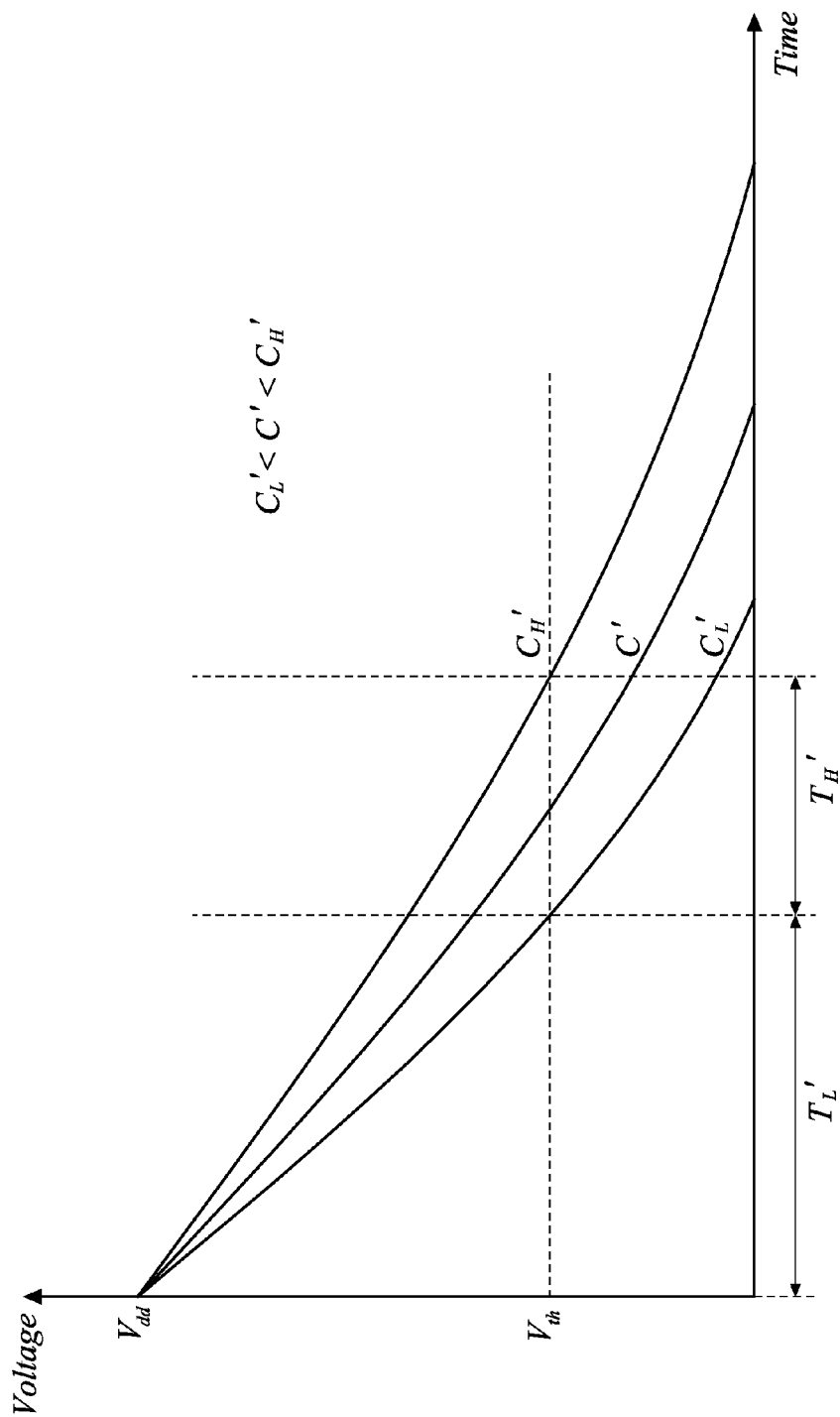
FIG. 8 shows a comparison of the threshold voltage of the TSV sensing and discharge time according to another embodiment of the present invention.

In the method shown in FIG. 6, the logic level of the TSV is determined by sense amplification technique, such as the sense amplification technique used in DRAM circuit. Therefore, two threshold voltages $V_{th\_H}'$ and $V_{th\_L}'$ are utilized, wherein the first voltage level $V_{dd}$ is greater than the second voltage threshold $V_{th\_H}'$, the second voltage threshold $V_{th\_H}'$ is greater than the third voltage threshold $V_{th\_L}'$, and the third voltage threshold $V_{th\_L}'$ is greater than ground voltage. However, to reduce the area overhead, the determination of the logic level of the TSV can be performed by other techniques, such as utilizing a circuit comprising a cascade of inverters, a tri-state buffer and a pull-down circuit. In such circuit, the second voltage threshold $V_{th\_H}'$ is equal to the third voltage threshold $V_{th\_L}'$ as $V_{th}$, and the first period of discharge time $T_L'$ is longer than the second period of discharge time $T_H'$. FIG. 8 shows another comparison of the threshold voltage of the TSV sensing and discharge time according to the method shown in FIG. 6 and the aforementioned circuit.

Figure 9:
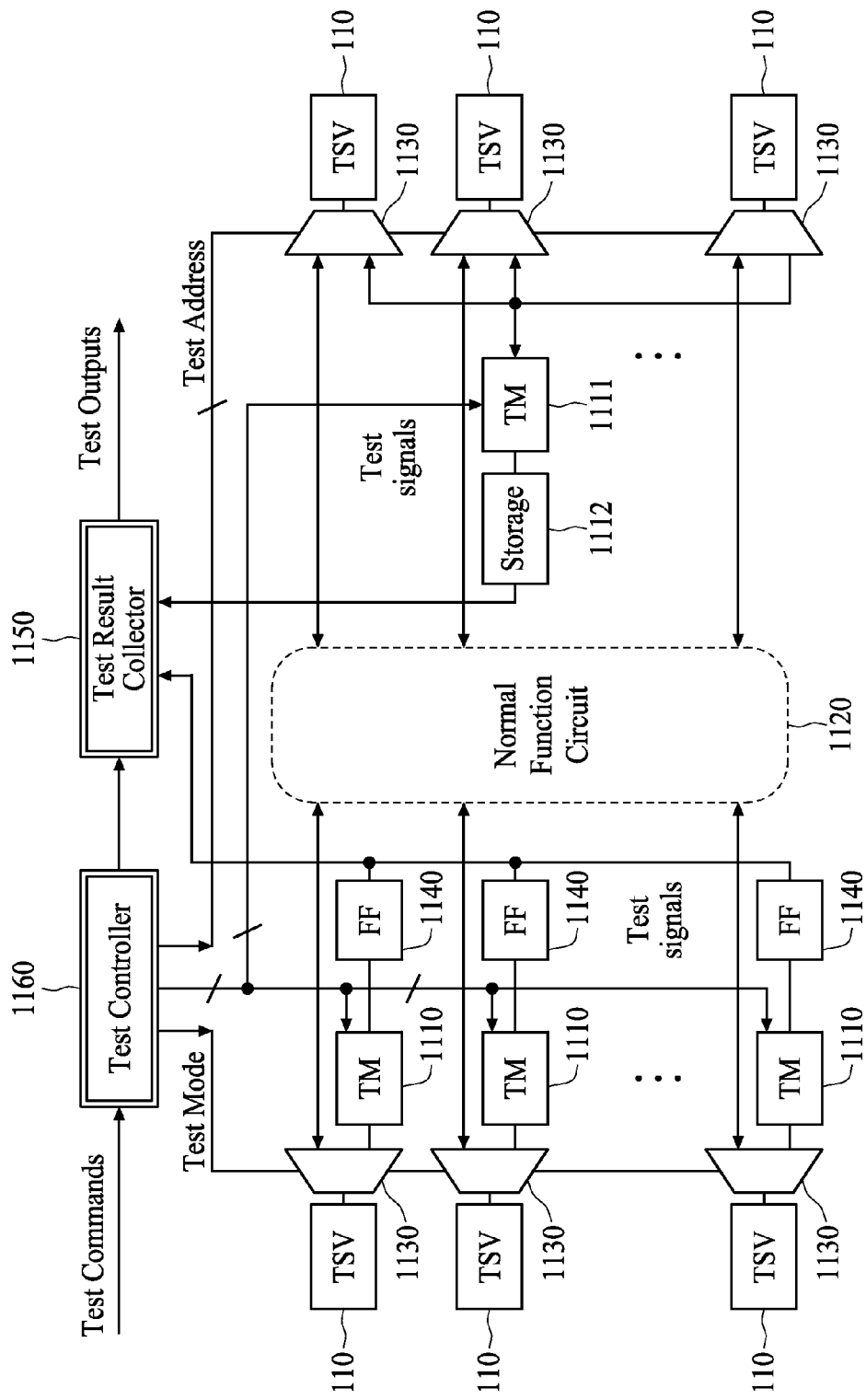
FIG. 9 shows a TSV test architecture according to one embodiment of the present invention.

FIG. 9 shows a TSV test architecture according to one embodiment of the present invention. As shown in FIG. 9, each TSV 110 at one side is connected to a test module 1110 and a normal function logic 1120 through a multiplexer 1130, while each TSV 110 at the other side are connected to a test module 1111 with a storage circuit 1112 and the normal function logic 1120 through a multiplexer 1130. During a test mode, a test controller 1160 receives a test commands, and switches each multiplexer 1130 to its corresponding test module 1110 or 1111, and each TSV 110 is controlled by its corresponding test module 1110 or 1111. A plurality of test signals are broadcasted from the test controller 1160 to each test module 1110, and the test results are captured by a plurality of flip-flops 1140 or the storage circuit 1112. All of the TSVs 110 can be tested in parallel. Preferably, a test result controller 1150 is utilized to collect the data from the flip-flops 1140 and the storage circuit 1112 and output the test output.

Figure 10:
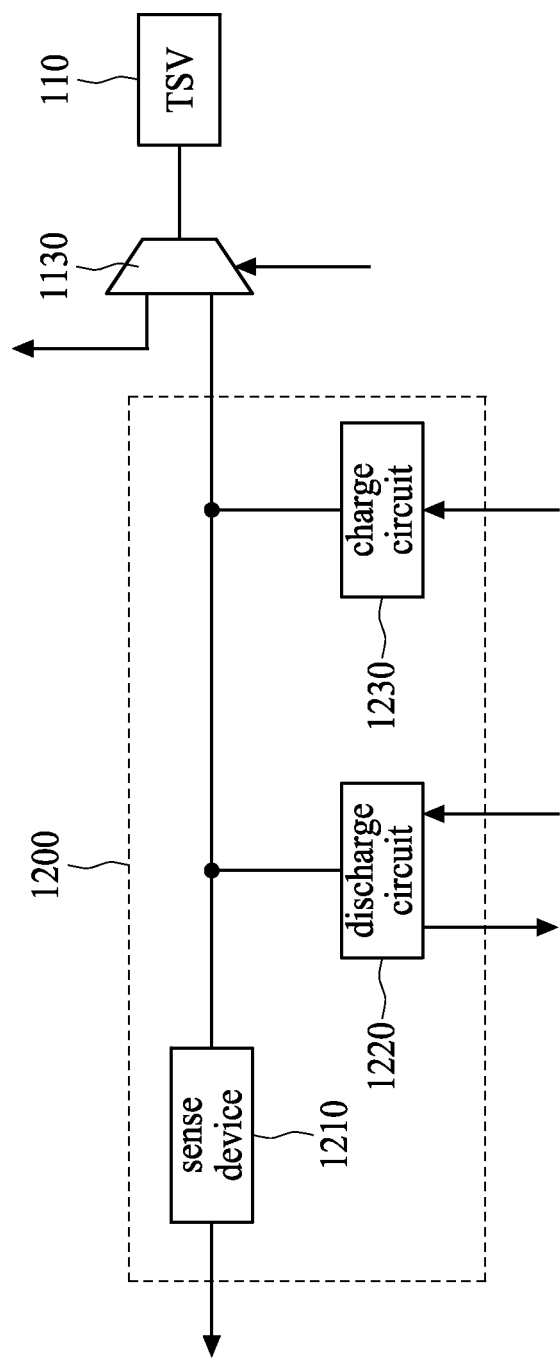
FIG. 10 shows a TSV test circuit according to one embodiment of the present invention.

FIG. 10 shows a TSV test circuit according to one embodiment of the present invention. As shown in FIG. 10, the TSV test circuit 1200 comprises a sense device 1210, a discharge circuit 1220 and a charge circuit 1230. The discharge circuit 1220 is configured to discharge the TSV 110, and is controlled by the test commands In some embodiments of the present invention, the discharge circuit 1220 may be used to discharge a plurality of TSVs 110. The charge circuit 1230 is configured to charge the TSV 110, and is controlled by the test commands In some embodiments of the present invention, the charge circuit 1230 may be used to charge a plurality of TSVs 110. The sense device 1210 is configured to sense the states of the TSV 110 and sends the sense result to a flip-flop 1140. In some embodiments of the present invention, the sense device 1210 may be used to sense the states of a plurality of TSVs 110. In some embodiments of the present invention, in order to minimize the area overhead, the charge circuit 1230 may comprise a tri-state buffer to act as a write driver, the discharge circuit 1220 may be implemented by an NMOS transistor, and the sense device 1210 may be implemented by a cascade of two inverters or a sense amplifier.

Figure 11:
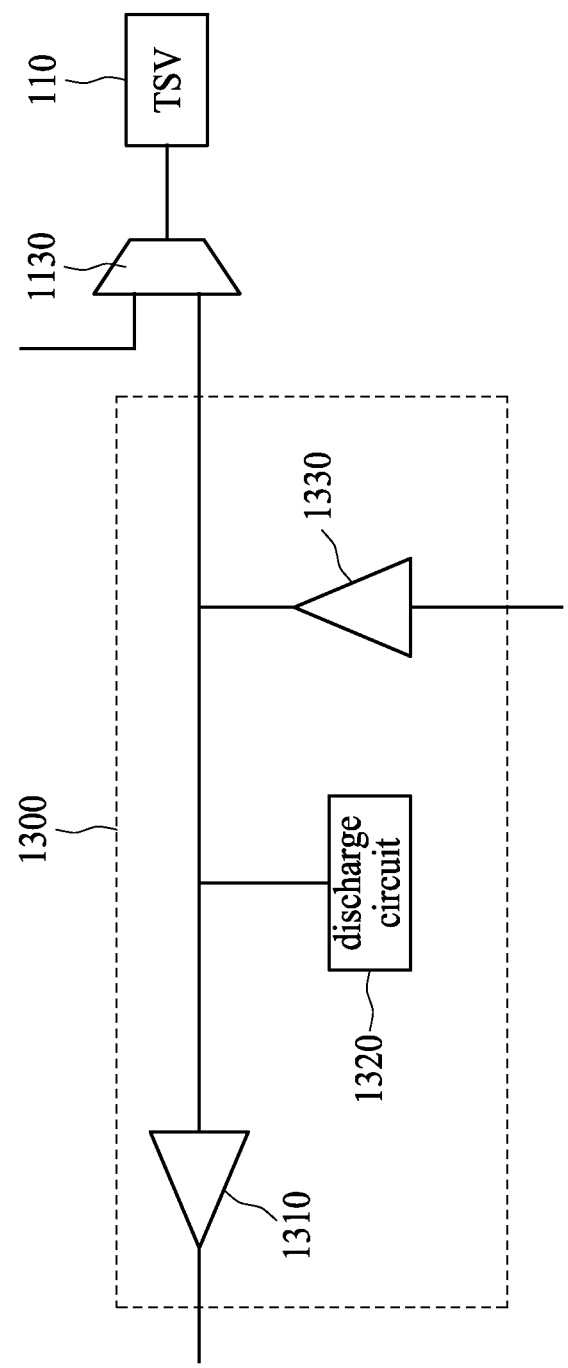
FIG. 11 shows a TSV test circuit according to another embodiment of the present invention.

FIG. 11 shows a TSV test circuit according to another embodiment of the present invention. As shown in FIG. 11, the TSV test circuit 1300 comprises a sense amplifier 1310, a discharge circuit 1320 and a charge circuit 1330. The discharge circuit 1320 is electrically coupled to the multiplexer 1130 and is configured to discharge the TSV 110. The charge circuit 1330 electrically coupled to the discharge circuit 1320 and is configured to charge the TSV 110. The sense amplifier 1310 is electrically coupled to the charge circuit 1330 and is configured to sense the states of the TSV 110.

Figure 12:
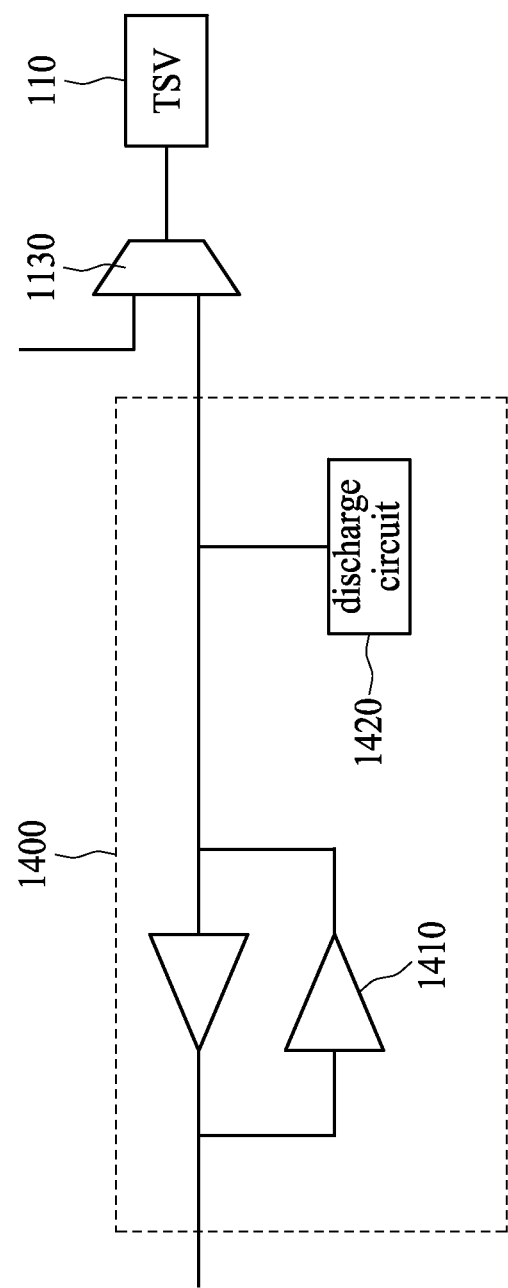
FIG. 12 shows a TSV test circuit according to yet another embodiment of the present invention.

FIG. 12 shows a TSV test circuit according to another embodiment of the present invention. As shown in FIG. 12, the TSV test circuit 1400 comprises a latch circuit 1410 and a discharge circuit 1420. The discharge circuit 1420 is electrically coupled to the multiplexer 1130 and is configured to discharge the TSV 110. The latch circuit 1410 is electrically coupled to the latch circuit 1410 and is configured to charge the TSV 110 and sense the states of the TSV 110.

Referring to FIG. 9, in some embodiments of the present invention, the TSV test procedure can be performed by the normal function logic 1120, and thus the multiplexers 1110 and other additional test circuits may be omitted.

Figure 13:
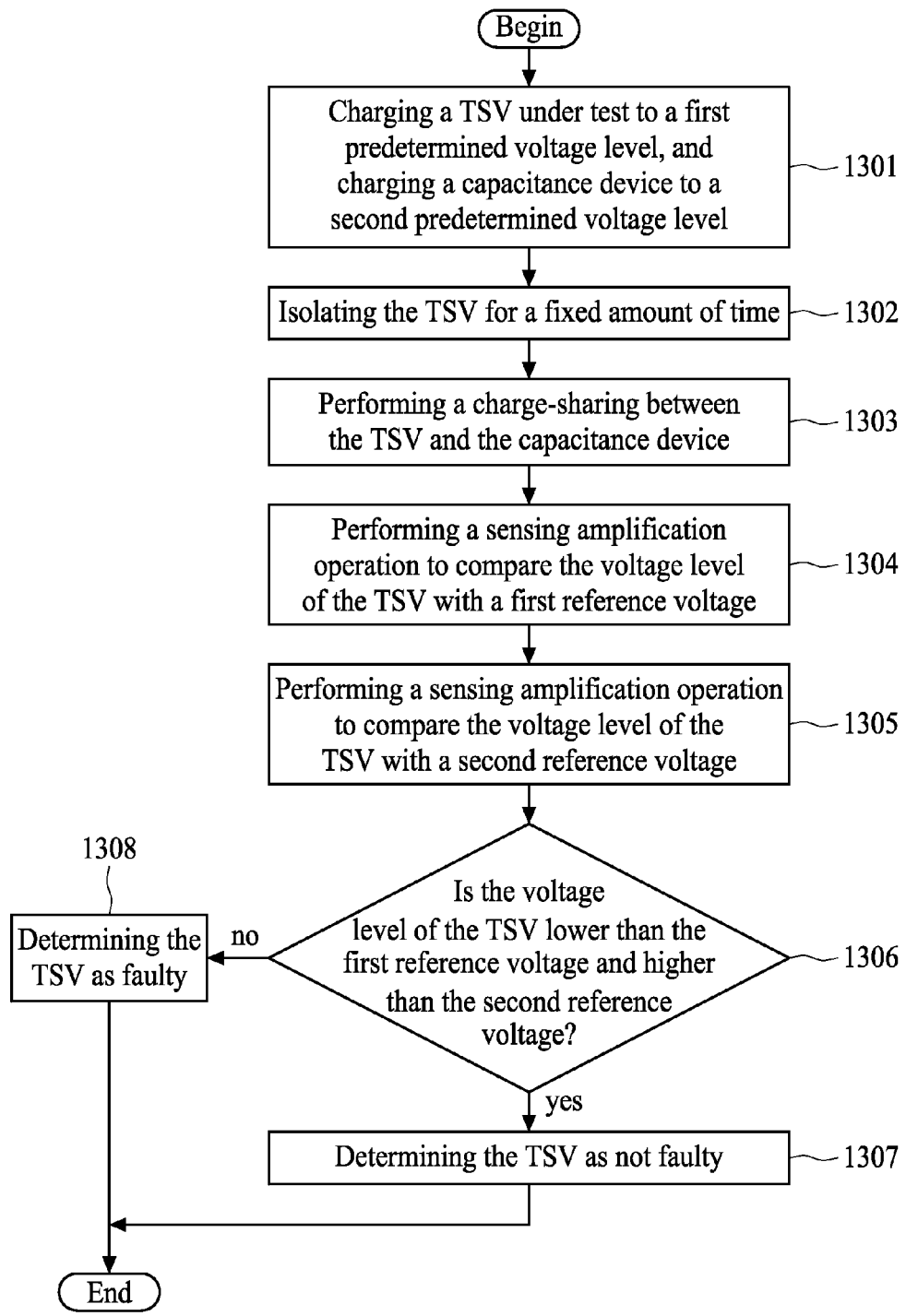
FIG. 13 shows the flowchart of a method for testing a TSV according to another embodiment of the present invention.

FIG. 13 shows the flowchart of a method for testing a TSV according to another embodiment of the present invention. In this method, the capacitance characteristic of a TSV is tested. In step 1301, a TSV under test is charged to a first predetermined voltage level, a capacitance device is charged to a second predetermined voltage level, and step 1302 is executed. In some embodiments of the present invention, the first predetermined voltage level is higher than second predetermined voltage level. In step 1302, the TSV is isolated for a fixed amount of time, and step 1303 is executed. In step 1303, a charge-sharing is performed between the TSV and the capacitance device, and step 1304 is executed. In step 1304, a sensing amplification operation is preformed to compare the voltage level of the TSV with a first reference voltage, and step 1305 is executed. In step 1305, another sensing amplification operation is preformed to compare the voltage level of the TSV with a second reference voltage, and step 1306 is executed. In step 1306, the voltage level of the TSV is checked. If the voltage level of the TSV is lower than the first reference voltage and higher than the second reference voltage, step 1307 is executed; otherwise, step 1308 is executed. In step 1307, the TSV is determined to be not faulty. In step 1308, the TSV is determined to be faulty.

Figure 14:
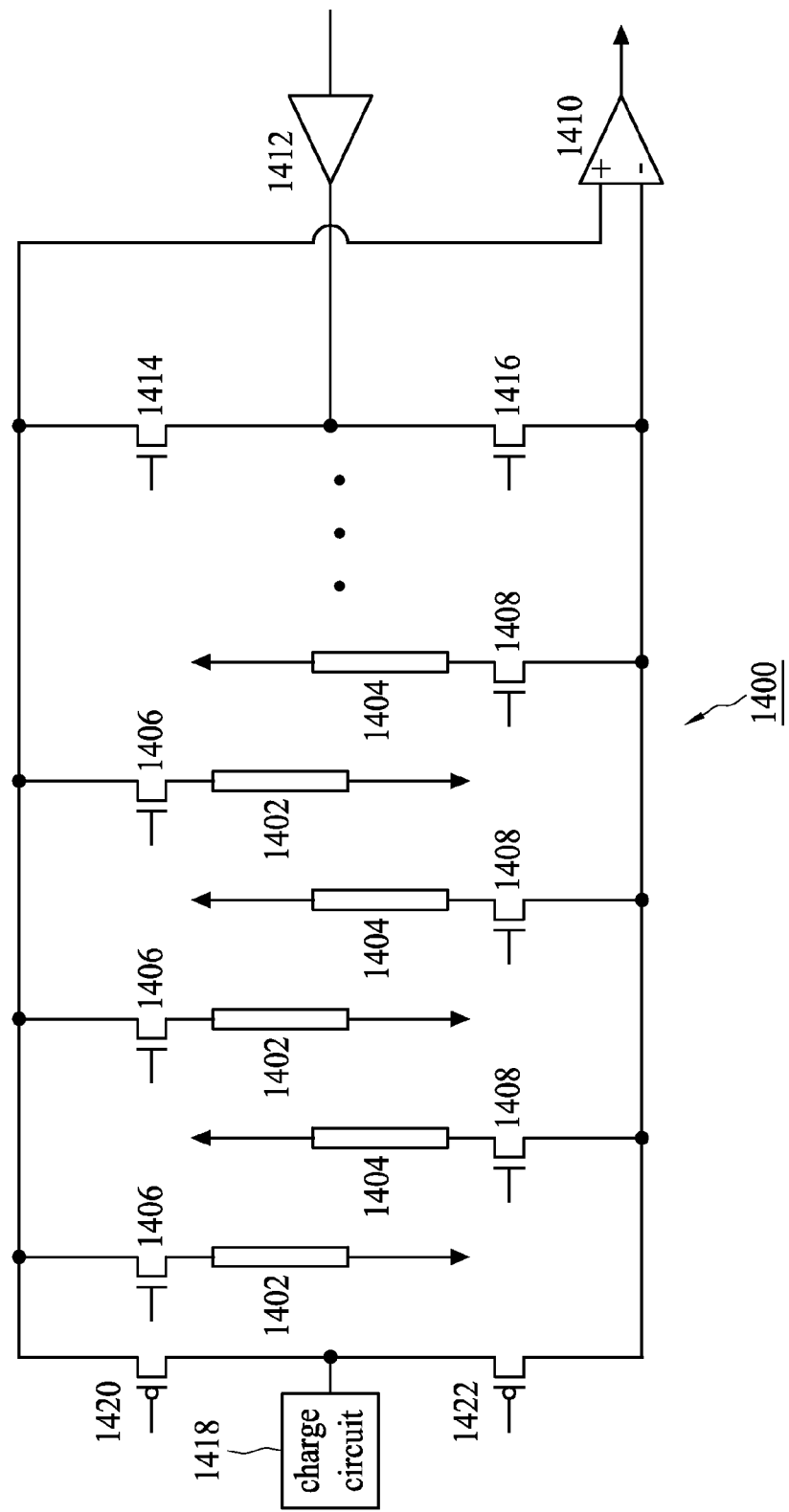
FIG. 14 shows a TSV test architecture according to one embodiment of the present invention.

FIG. 14 shows a TSV test architecture 1400 according to another embodiment of the present invention. As shown in FIG. 14, one end of each TSV 1402 is connected to the positive input terminal of a sensing device 1410, which is a sense amplifier, through a switch device 1406, and the other end of each TSV 1402 is floated. Similarly, one end of each TSV 1404 is connected to the negative input terminal of the sensing device 1410 through a switch device 1408, and the other end of each TSV 1404 is floated. A charge circuit 1412, which is a write buffer, is configured to charge the TSVs 1402 through a switch device 1414, and charge the TSVs 1404 through a switch device 1416. In addition, each switch device 1406 is connected to another charge circuit 1418 through a switch device 1420, and each switch device 1408 is connected to the charge circuit 1418 through a switch device 1422.

Figure 15:
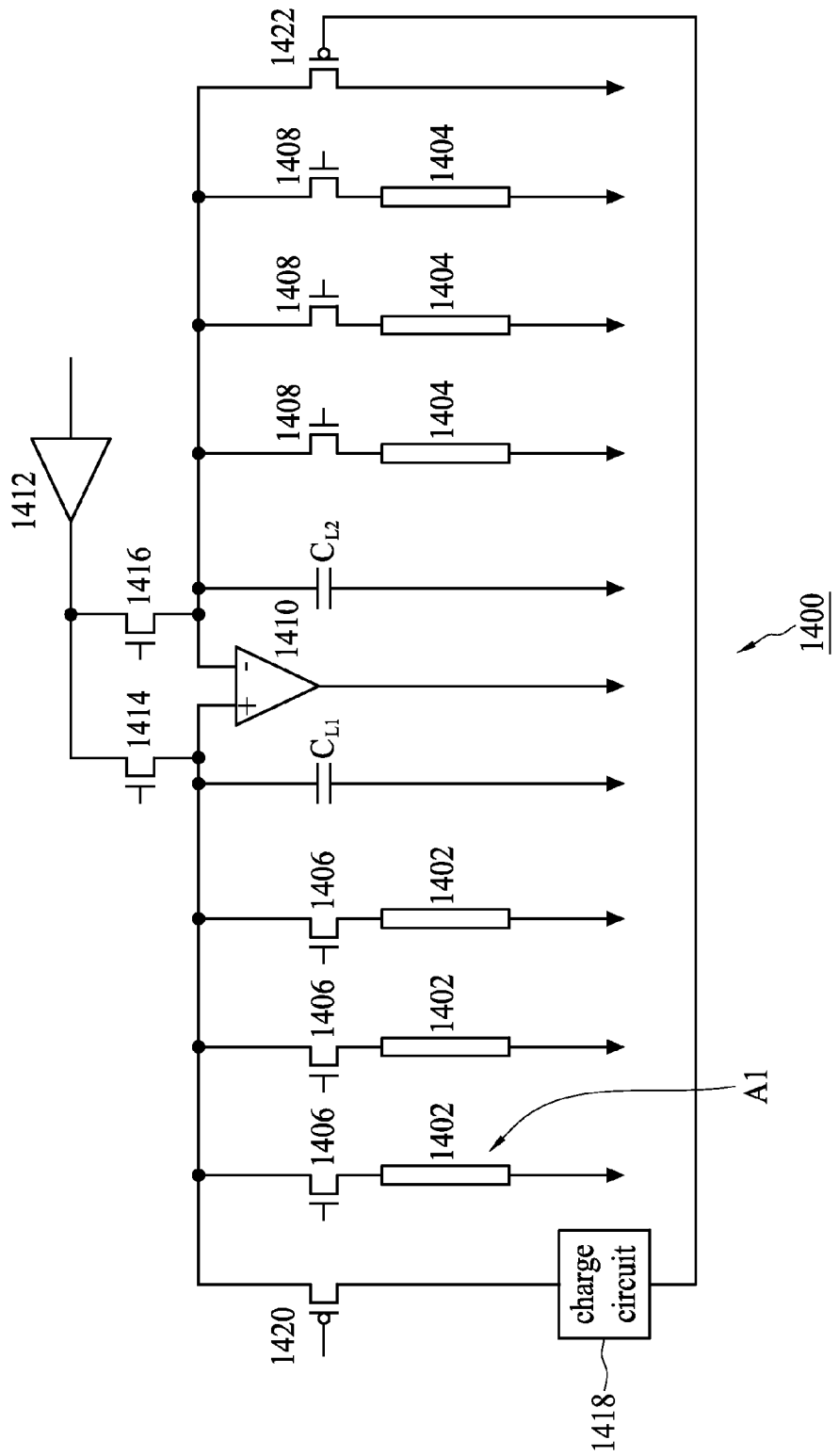
FIG. 15 shows a TSV test architecture according to one embodiment of the present invention.

FIG. 15 shows another view of the TSV test architecture 1400. As shown in FIG. 15, the TSVs 1402 are shown on the left side of the sensing device 1410, and the TSVs 1404 are shown on the right side of the sensing device 1410. In addition, there is a capacitance device $C_{L1}$ connected to the positive input terminal of a sensing device 1410, and there is another capacitance device $C_{L2}$ connected to the negative input terminal of a sensing device 1410.

The following illustrates applying the method shown in FIG. 13 to the TSV test architecture 1400, wherein the TSV 1402 indicated by the arrow A1 is being tested. In step 1301, both the switch device 1406 connected to the TSV under test 1402 and the switch device 1414 are turned on. Accordingly, the charge circuit 1412 charges the TSV under test 1402 to the first predetermined voltage level, $V_{dd}$. Next, the switch device 1406 connected to the TSV under test 1402 and the switch device 1414 are turned off. The switch device 1420 is turned on. The charge circuit 1418 then charges the capacitance device $C_{L1}$ to the second predetermined voltage level, $V_{load}$.

In step 1302, the TSV under test 1402 is isolated for a fixed amount of time such that the voltage level of the TSV under test 1402 is stabilized. In step 1303, the switch device 1406 connected to the TSV under test 1402 is turned on, and the other switch devices 1406 and the switch devices 1414 and 1420 are turned off. Accordingly, a charge sharing procedure is performed between the TSV under test 1402 and the capacitance device $C_{L1}$. In step 1304, a sensing amplification operation is performed on the TSV under test 1402 and a TSV 1404 or the capacitance device $C_{L2}$, wherein either the TSV 1404 or the capacitance device $C_{L2}$ is charged to the first reference voltage. Accordingly, whether the voltage level of the TSV under test 1402 is lower than the first reference voltage is determined. In step 1305, another sensing amplification operation is performed on the TSV under test 1402 and a TSV 1404 or the capacitance device $C_{L2}$, wherein either the TSV 1404 or the capacitance device $C_{L2}$ is charged to the second reference voltage. Accordingly, whether the voltage level of the TSV under test 1402 is lower than the second reference voltage is determined. In step 1306, the voltage level of the TSV under test 1402 is checked. If the voltage level of the TSV under test 1402 is lower than the first reference voltage and higher than the second reference voltage, i.e., if the capacitance characteristic of the TSV under test 1402 is deemed normal, then the TSV under test 1402 is determined to be not faulty.

In some embodiments of the present invention, the capacitance devices $C_{L1}$ and $C_{L2}$ are TSVs. In some embodiments of the present invention, the capacitance devices $C_{L1}$ and $C_{L2}$ are the parasitic capacitance of the TSV test architecture 1400.

In conclusion, the method for testing a TSV of the present invention exploits the property of TSVs such that the test process can be performed on individual TSVs. Accordingly, the method for testing a TSV of the present invention can be performed on various kinds of TSVs, especially those formed by via-first process that is difficult to test for conventional method. In addition, since the method for testing a TSV of the present invention can be performed by the test circuit, which is on the same IC as that on which the TSV under test is disposed, the method can be performed before the IC on which the TSV is disposed is bonded to another IC. Therefore, the method for testing a TSV of the present invention can be performed before the bonding process, and thus can increase yield significantly and reduce the implementation cost.

The above-described embodiments of the present invention are intended to be illustrative only. Those skilled in the art may devise numerous alternative embodiments without departing from the scope of the following claims.

What is claimed is:

1. A method for testing a through-silicon-via, comprising the steps of:
   charging a through-silicon-via under test to a first predetermined voltage level;
   charging a capacitance device to a second predetermined voltage level;
   performing charge-sharing between the through-silicon-via and the capacitance device; and
   determining that the through-silicon-via under test is not faulty if the voltage level of the through-silicon-via after the charge-sharing step is within a predetermined range, wherein the determining step is performed by a sensing amplification technique.

2. The method of claim 1, wherein the through-silicon-via is isolated for a fixed amount of time between the through-silicon-via charging step and the charge-sharing step.

3. The method of claim 1, wherein the determining step further comprises the sub-steps of:
   comparing the voltage level of the through-silicon-via with a first reference voltage;
   comparing the voltage level of the through-silicon-via with a second reference voltage; and
   determining that the through-silicon-via under test is not faulty if the voltage level of the through-silicon-via is lower than the first reference voltage and higher than the second reference voltage.

4. The method of claim 1, wherein the first predetermined voltage level is higher than the second predetermined voltage level.

5. The method of claim 1, wherein the through-silicon-via is formed by via-first process.

6. The method of claim 1, which is performed before an IC on which the through-silicon-via is disposed is bonded to another IC.

7. A method for testing a through-silicon-via, comprising the steps of:
- charging a through-silicon-via under test to a first predetermined voltage level;
- charging a capacitance device to a second predetermined voltage level;
- performing charge-sharing between the through-silicon-via and the capacitance device; and
- determining that the through-silicon-via under test is not faulty if the voltage level of the through-silicon-via after the charge-sharing step is within a predetermined range,
- wherein the method is performed before an IC on which the through-silicon-via is disposed is bonded to another IC.

\* \* \* \* \*